United States Patent
Philipp

(12) 
(10) Patent No.: US 6,377,009 B1
(45) Date of Patent: Apr. 23, 2002

(54) CAPACITIVE CLOSURE OBSTRUCTION SENSOR

(76) Inventor: Harald Philipp, 7 Cirrus Gardens, Hamble, Hampshire S031 4RH (GB)

( * ) Notice: Subject to any disclaimer, the term of this patent is extended or adjusted under 35 U.S.C. 154(b) by 0 days.

(21) Appl. No.: 09/656,796

(22) Filed: Sep. 7, 2000

Related U.S. Application Data

(60) Provisional application No. 60/152,605, filed on Sep. 8, 1999.

(51) Int. Cl.[7] .................................................. E05F 15/16
(52) U.S. Cl. ............................. 318/468; 318/266; 49/26
(58) Field of Search ................................ 318/264, 265, 318/266, 282, 286, 466, 467, 468, 469; 49/26, 27, 28; 324/676, 677, 678; 701/36, 45

(56) References Cited

U.S. PATENT DOCUMENTS

| | | | |
|---|---|---|---|
| 4,453,112 A | | 6/1984 | Sauer et al. |
| 4,983,896 A | * | 1/1991 | Sugiyama et al. ........... 318/286 |
| 5,051,672 A | * | 9/1991 | Yaguchi ...................... 318/469 |
| 5,621,290 A | | 4/1997 | Heller et al. |
| 5,730,165 A | | 3/1998 | Philipp |
| 5,802,479 A | * | 9/1998 | Kithil et al. ................... 701/45 |
| 6,158,170 A | * | 12/2000 | Brodowsky ..................... 49/28 |

FOREIGN PATENT DOCUMENTS

| | | |
|---|---|---|
| GB | 2026723 A | 2/1980 |
| WO | WO01/14676 A1 | 3/2001 |

* cited by examiner

*Primary Examiner*—Bentsu Ro
(74) *Attorney, Agent, or Firm*—David Kiewit

(57) ABSTRACT

A system for preventing the pinching or trapping of a human body part or foreign object by a closing panel, which may be a window, door, sunroof, hood or trunk lid, or other closure part of a transport vehicle operates by capacitively sensing the human body part, either before contact with a sensing electrode or plate, or at the time of contact with the plate. The sensing electrode may be a metal strip or wire, which can be embedded in a plastic or rubber molding strip, placed behind a piece of fascia or other trim part, or may simply be a metal element on top of the trim parts. Sensing electrodes of this sort can be prepared from conductive ink, made of adhesive backed metal foil, formed from a metal mesh strip, or simply be a wire or serpentine-laid wire. The capacitive sensing technology that follows the "charge transfer" approach and provides immunity from environmental effects, such as moisture and humidity.

15 Claims, 3 Drawing Sheets

CAPACITIVE CLOSURE OBSTRUCTION SENSOR

CROSS REFERENCE TO RELATED APPLICATIONS

This application claims the priority of U.S. Provisional Application No. 60/152,605, filed Sep. 8, 1999.

STATEMENT REGARDING FEDERALLY SPONSORED RESEARCH OR DEVELOPMENT

Not Applicable

BACKGROUND OF THE INVENTION

1. Field of the Invention

This application pertains to safety means responsive to an obstruction to closure of a movable closure element, and is particularly applicable to anti-trap window sensing for use in automobiles.

2. Background Information

A safety problem associated with powered panel closures is that a person, animal, or inanimate object may get in the way of the moving panel. This can obstruct the motion of the panel, but more importantly, can cause severe injury. Of particular interest is the operation of electrically powered automobile windows and the provision of an effective means to limit and reverse window travel when a human body part is sensed near the top of the window frame upon closure.

BRIEF SUMMARY OF THE INVENTION

An objective of the invention is to prevent the pinching or trapping of a human body part or foreign object in a window, door, sunroof, hood or trunk lid, or other closure part of a transport vehicle such as a car, van, train, bus, truck, or other conveyance. In general, the invention attains this goal by capacitively sensing the human body part, either before contact with a sensing electrode or plate, or at the time of contact with the plate. The sensing electrode may be a metal strip or wire, which can be embedded in a plastic or rubber molding strip, placed behind a piece of fascia or other trim part, or may simply be a metal element on top of the trim parts. Sensing electrodes of this sort can be prepared from conductive ink, made of adhesive backed metal foil, formed from a metal mesh strip, or simply be a wire or serpentine-laid wire.

The preferred capacitive sensing technology employed in the present invention is the "charge transfer" approach developed by the inventor and taught in his U.S. Pat. No. 5,730,165, the disclosure of which is herein incorporated by reference. This form of capacitive proximity sensing uses switching elements to transfer electric charge to and from the sensing plate. Charge cancellation features of this approach allow for a very wide dynamic range and great stability. Although charge transfer is the preferred approach for the invention herein disclosed, this technology is not essential to make such a system operate, and other capacitive techniques known in the art may be used.

Another object of the invention is provide a panel closure sensor that is immune to the effects of moisture and humidity, which are known to seriously affect the performance of many capacitive sensors when water contacts or is capacitively coupled to their sensing electrodes. As described in the inventor's U.S. Pat. No. 5,730,165, one of the features of the charge transfer sensing approach is a 'short pulse' mode which is notable for its moisture suppression attributes. Thus, a sensor of the invention that comprises a sensing electrode built into or located behind an elastomeric automotive window frame channel is not affected by the presence of water condensed on the window or on the elastomeric channel.

Yet another object of the invention is to provide a capacitive sensor for a panel closure control system that is not affected by either rapidly or slowly changing environmental conditions. A preferred sensor of the invention comprises 'smart algorithms' that adapt dynamically to the environment. This feature allows the sensor to ignore changes in ambient temperature, changes in window mechanics and dynamics, and the build-up of dirt and underlying changes in material properties over long periods of time. In a preferred embodiment, this involves two mechanism of adaptation: A) A full recalibration of the signal reference point internal within the sensor, so that the baseline signal is known. B) A mechanism for compensation for slow change in signals over time, i.e., signal drift, whereby the baseline internal reference level is altered more slowly than in the case of full recalibration to accommodate slow changes in signal due to humidity or changing mechanical parameters.

Yet another object of the invention is to provide sensing and control apparatus in which the sensitivity to an obstruction (e.g., a person's hand) is not affected by whatever proximity signals are measured from the panel that is being closed. In a preferred embodiment of the invention the sensor records the amount of signal generated by the closure part during a normal and unobstructed closure, correlates that signal with the degree of closure; and creates a table of values of expected signal vs. closure part extension, which is later used to create a 'subtraction signal' to remove the effects of the normal closure part from a signal that may also comprise component due to an obstruction. That is, the system subsequently controls the motor to move the panel from the open to the closed state and compares, at each of the plurality of position values sensed by suitable position sensing means, the respective stored capacitance value with a currently measured capacitance value; and stops the motion of the panel if the stored and the currently measured capacitance values differ by more than a predetermined threshold amount.

Conversely, it is a related object of the invention to provide sensing and control apparatus in which small changes in the sensing plate's environment (e.g., change in dimension of a rubber window channel that enrobes a sensing wire) do not cause false alarms in which the travel of panel is stopped short of closure even though no obstruction is present This may be done by desensitizing the system as the panel nears its closed state (e.g., during the last one or two centimeters of the travel of a dosing window). In the case of a system using an expected signal table, as described in the preceding paragraph, one can use two threshold values. The larger of the two threshold values is used when the panel is within some predetermined distance of its closed state. The smaller of the two threshold values is applied during the rest of the travel distance between the open and the closed states.

Yet a further object of the invention is to provide a control system that does not respond to an obstruction when a controlled panel is in either of its opened or closed states. For example, an automotive window control system should not open a fully dosed window if a passenger accidentally or intentionally places his or her hand adjacent a top of the window frame. Nor should such a system attempt to open a window that was already in its fully opened state. Thus, a preferred system of the invention comprises at least one end-of-travel sensor or other means of sensing when a controlled panel is in its opened or closed positions. The sensing elements used for this function may be different from those employed for sensing obstruction during periods in which the panel is traveling between the two limiting positions.

A control system of the invention that is responsive to an obstruction to a panel closure may involve the use of other sensors in addition to a capacitive anti-trap sensor. Generally speaking, a system of this sort uses a motor to move a panel from an open state in which a leading edge of a panel is distal from a frame portion to a closed state in which the leading edge is adjacent the portion of the frame. The system comprises a controller that controls the motor responsive to various sensor and switch inputs, and has end-of-travel sensors for sensing when the panel is in the opened or the closed state. The control system of the invention comprises a capacitive obstruction sensing means comprising a sensing plate near or within the panel frame, a source of DC current for charging the plate; a voltage pulse source; and a discharging switch having an open state and a closed state, the discharging switch moving from its open to its dosed state responsive to the voltage pulse, the discharging switch connecting the plate to a charge measuring means when in the dosed state, the discharging switch otherwise not connecting the plate to the charge measuring means. In preferred embodiments the capacitive sensor further comprises both a charging and a discharging switch.

In the particular application of providing an anti-trap sensor for an automobile window, one must provide for satisfactory operation even when the window and frame are wet In these cases the capacitive sensing plate is electrically coupled to an electrical ground by a shunting conductor (i.e., the water) substantially conducting electrical current pulses having durations greater than a first predetermined value, but not conducting current pulses having durations less than a second predetermined value. The invention uses short duration voltage pulses for capacitive measurement in order to allow the anti-trap sensor to ignore the effects of water films or of high humidity.

Although it is believed that the foregoing recital of features and advantages may be of use to one who is skilled in the art and who wishes to learn how to practice the invention, it will be recognized that the foregoing recital is not intended to list all of the features and advantages. Moreover, it may be noted that various embodiments of the invention may provide various combinations of the hereinbefore recited features and advantages of the invention, and that less than all of the recited features and advantages may be provided by some embodiments.

DETAILED DESCRIPTION OF THE INVENTION

Figure 1:
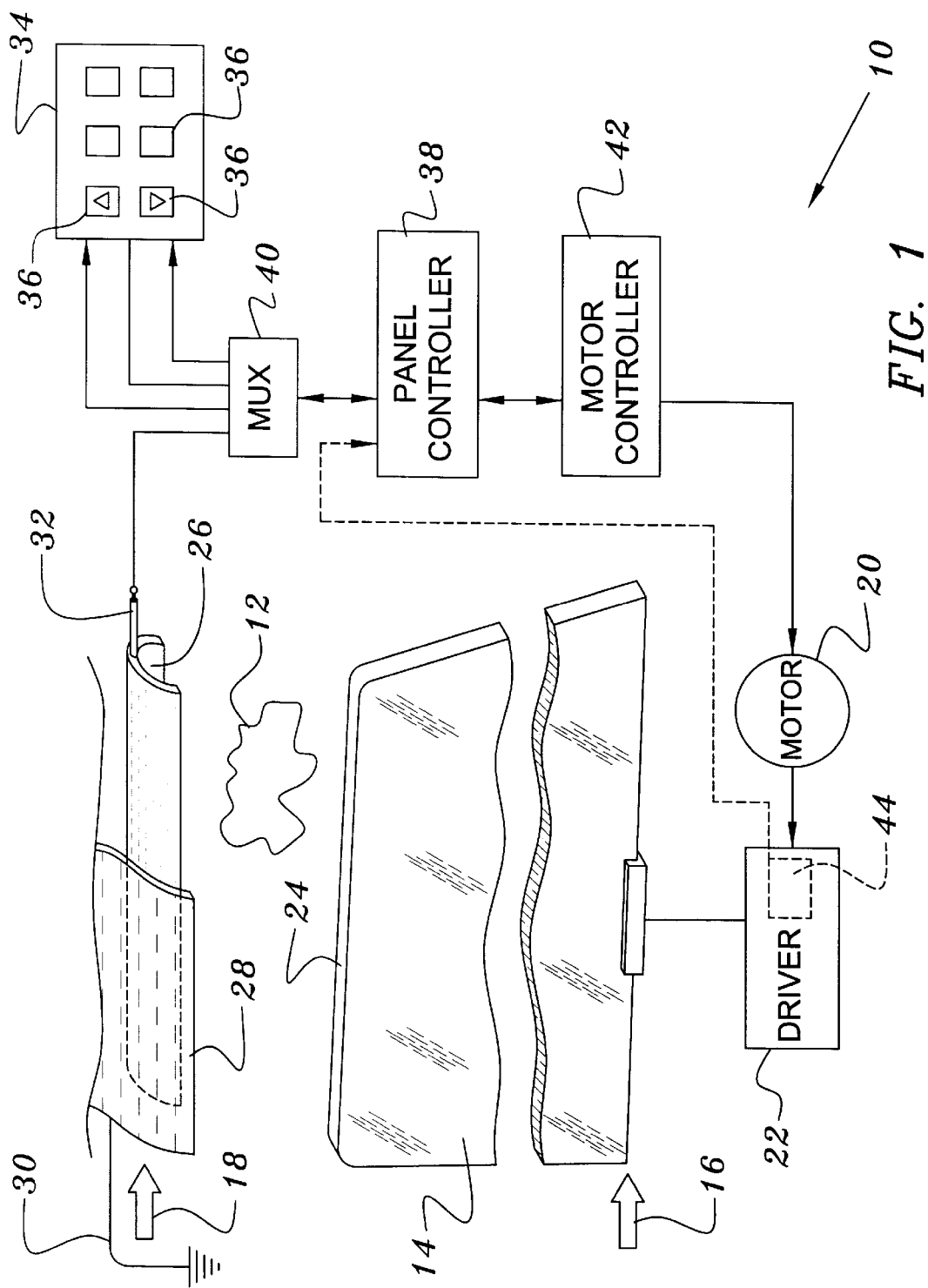
FIG. 1 is a schematic depiction of a control system of the invention.

A system of the invention 10 may be used for detecting the presence of an obstruction 12, which may be a person's hand, to the motion of a panel 14 driven between an open end-of-travel position 16 and a closed end-of-travel position 18 by a motor 20 drivingly coupled to the panel 14 by any of a number of well-known mechanical drive arrangements 22. Although the ensuing disclosure presented herein is principally concerned with the motion of a glass window panel within a frame that is a portion of an automobile body, it will be recognized by those skilled in the art that these sensing and control arrangements are applicable to any sort of panel closure. Moreover, although the word "frame" is most commonly used herein to describe a window frame, it will be clear to those skilled in the art that in the most general sense the only "frame" required by the invention is a mechanical element, movable or stationary, that a leading edge of the panel is adjacent when the panel is in the closed state.

In the embodiment depicted in FIG. 1, the panel is an automobile window moving within a conventional frame and having a closed end-of-travel 18 in which a leading edge 24 of the panel is captured within an elastomeric channel 26 located within a metallic frame portion 28 connected to the vehicle's electrical ground 30, commonly called a chassis ground. A capacitive sensing plate 32, which may be a wire enrobed in the elastomeric channel, is placed in a position near where the leading edge 24 of the panel will come to rest when it is fully closed. Those skilled in the arts of capacitive proximity sensing will understand that many other placements and configurations for the sensing electrode 32 are possible, and include, but are not limited to, locating the plate 32 behind a piece of fascia or other trim part, or adhering a metal element on an outer surface of the trim parts; moreover, the electrode 32 could be printed onto a surface with conductive ink, made-of adhesive backed metal foil, formed of a metal mesh, or be a serpentine-laid wire. Those skilled in the art will also realize that the use of an automobile window is merely illustrative, and that the proximity sensing method of the invention can be used with a wide variety of panels 14.

With regard to the matter of the sensor of the invention being immune to the effects of ambient moisture, one may note that some of the various choices of sensing plate design described above may be subject to a direct galvanic contact with a water film (e.g., a metal plate glued to an exposed portion of a window or door frame), while others might be shielded from direct contact by an intervening insulating layer (e.g., a wire embedded in an elastomeric window channel). In either case the presence of the film changes the low frequency capacitance to ground of the plate and effects the performance of many prior art capacitive sensors. The inventor's charge transfer sensing approach, as taught in his U.S. Pat. No. 5,730,165, uses sufficiently short pulses that the presence of a water film does not significantly alter the performance of the obstruction sensing system 10, regardless of whether the plate is directly electrically connected to the water film or is merely capacitively coupled thereto.

Returning to the exemplar automobile window control arrangement of FIG. 1, one finds an operator control panel 34 that is normally configured as a keypad having UP and DOWN keys 36 used by an operator to command the panel controller 38, which is preferably a microcontroller or microprocessor of the sort commonly used in the control arts, to open or dose the panel 14. It will be understood by those skilled in the art that other operator control keys are often used to allow for locking a window actuator, for providing either full motion or progressive raising and lowering, etc. Although the system of the invention can be designed to operate with prior art keypads, in a preferred system of the invention the keys 36 are capacitive proximity switches responsive to an object adjacent a key, where the sensed object is generally a portion of the body of an operator touching, otherwise bringing a portion of his body immediately adjacent a key that he or she has selected to operate. In this case a multiplexer 40 can be used to scan the keys 36 on the control panel 34 and each of the sensing plates 32 associated with a respective powered window of the vehicle.

In addition to receiving inputs from the sensing plate 32 and operator controls 34, the preferred panel controller 38 receives other inputs indicative of the panel position. It is well known, for example, that an end of travel of a panel can be detected by measuring an increase in motor current when the drive mechanism stalls and essentially locks the motor's rotor. Thus, a measure of the current delivered by a preferred bidirectional motor controller 42 can provide a means of sensing both the open 16 and closed 18 ends of travel of the panel 14. In some embodiments an encoder 44 can be used both for detecting end of travel and for providing a signal to the controller 38 indicative of the actual position of the panel at any time during a closure or opening operation.

Figure 2:
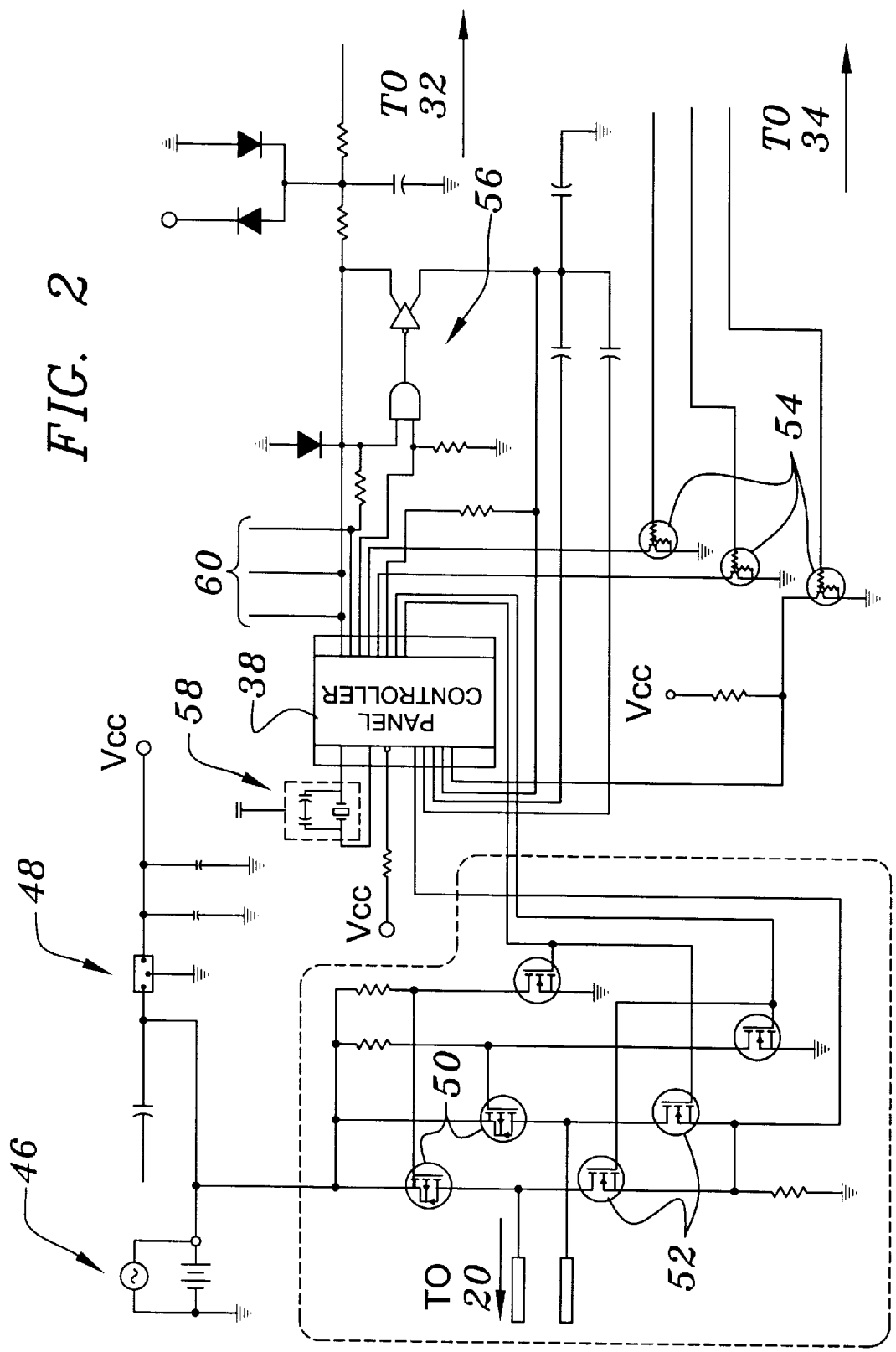
FIG. 2 is a circuit schematic of a portion of a control system of the invention.

A specific example of a portion of a control system of the invention is depicted in FIG. 2. Unregulated electric power is supplied by the vehicle's charging system 46 to the motor controller 42 and to a power supply circuit 48, which may be any of a number of such circuits known in the art. The motor controller 42, in this example, is a H-bridge circuit comprising MOSFET power transistors of both P 50 and N 52 types. This sort of circuit, as is known in the art, can provide bi-directional control to the motor 20. The operator inputs 34, in this example, are provided by non-multiplexed, metallic contact switches connected to the controller 38 by respective transistors 54. In this example there are three such inputs, one for an UP command, one for DOWN, and a third one used for continuity checks. An input from the sensing plate 32 is also supplied to the controller 38. To provide robust sensing in the presence of moisture, a switch transfer circuit is controlled by the controller 38 (which has an input from a reference timing oscillator 58) to drive the sensing plate 32 with pulses having a pulse width of less than preferably eighty nanoseconds. The controller 38 also has several programming input connections used to provide adaptive control features such as those taught in the inventor's U.S. Pat. No. 5,730,165.

Figure 3:
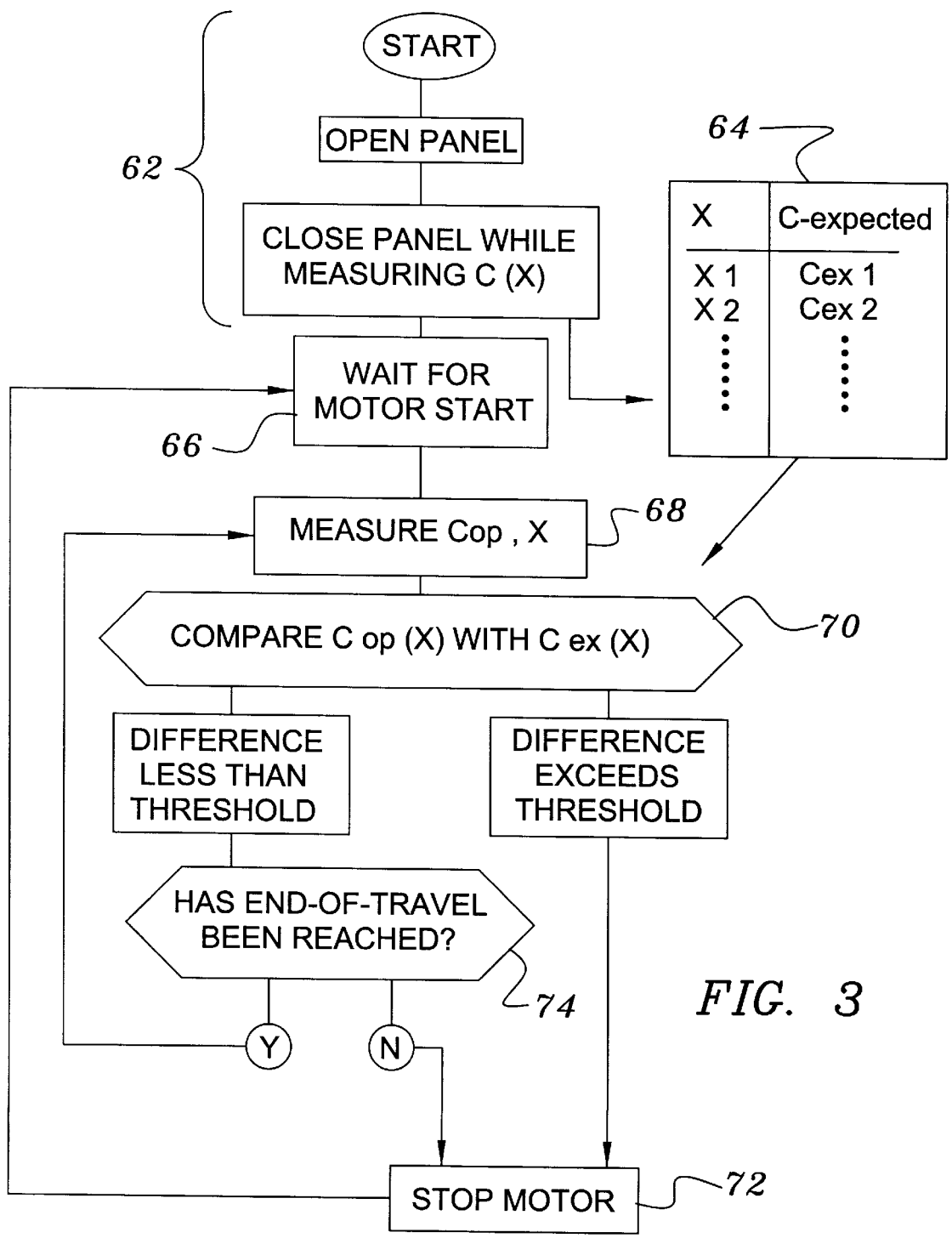
FIG. 3 is a flow chart depicting operation of a preferred control system of the invention.

Turning now to FIG. 3, one finds a top level flow chart depicting steps in the operation of a controller 38 that is programmed to provide adaptive control of a panel closure subject to obstructions. An initial, set-up 62, portion of the program, is run a single time after the system 10 has been installed with whatever panel 14 is to be controlled. During the set-up phase 62, a sequence of measurements of capacitance are made at each of predetermined set of instantaneous positions of travel of the panel (e.g., as may be obtained from an output of an encoder 44). These measurements are saved in a non-volatile computer memory as a table 64 of pairs of position and associated capacitance measurements. There is no obstruction to panel motion during the set up phase, so the initially stored table 64 documents whatever normal background capacitance is observed due to the panel and to proximity of other structural members to the sensing plate.

After the system 10 has been initially configured, as described above, whenever the motor 20 is operated (Step 66) the system measures capacitance as a function of position (Step 68) and compares the currently measured value of capacitance at a given position with the corresponding value of capacitance that was stored in the table 64 (Step 70). If the two values differ by more than a predetermined threshold value, which could be indicative of an obstruction to panel motion, the motor may be stopped or reversed (Step 72). If the stored and current values of capacitance differ by less than the threshold amount, the system then looks for an end-of-travel indication (Step 74). If the end of travel has not been reached, panel motion continues and the control system loops back to measure another capacitance at the next selected position.

As previously noted in this disclosure, one of the objects of the invention is to provide sensing and control apparatus in which small changes in the sensing plate's environment (e.g., change in dimension of a rubber window channel 26 that enrobes a sensing wire 32) do not cause false alarms in which the travel of panel is stopped short of closure even though no obstruction is present This may be done by using two threshold values in the comparison step 70, with the larger of the two threshold values being used when the panel is within some predetermined distance of its closed end of travel. The smaller of the two threshold values is applied during the rest of the travel distance between the open and the closed states. Hence, the system is desensitized as the panel nears its closed state in which the leading edge of the panel is adjacent the frame (e.g., during the last one or two centimeters of the travel of a closing window).

Some of the adaptive features of the inventor's charge transfer capacitance sensing approaches have already described in detail in his U.S. Pat. No. 5,730,165. It may be noted that the ability to allow the sensing methodology to adapt to changes in environment are of particular use in considering panel closures that are subject to effects of electronic component aging, mechanical wear, temperature changes, and other environmental effects. For example, an offset value may be introduced by measuring capacitance when the panel is in a known unobstructed position (e.g., when a car window is fully dosed) and then changing the threshold value by the difference between the current capacitance value and the value stored for that position. This has the effect of introducing an offset value into all the comparisons made between current and stored tabular values during the next closure motion.

It is also possible to change some or all of the stored tabular values in order to adapt the system to the environment. For example, one could store capacitance and position data during a panel operation and, if no obstruction was detected, could alter each of the values in the look-up table 64 by a small amount—e.g., by adding or subtracting a one in the least significant bit of the affected stored capacitance value, where the choice between addition or subtraction would be made so as to bring the altered value into closer accord with the currently measured value.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. A control system responsive to an obstruction to a panel closure, the panel adapted to be moved by a motor from an open state to a closed sate in which a leading edge of the panel is adjacent a predetermined portion of a frame, the system comprising;
   a controller adapted to control the motor;
   end-of-travel sensing means adapted to provide an output to the controller when the panel is in one of the open state or the closed state;

capacitive obstruction sensing means comprising a plate disposed adjacent the predetermined portion of the frame, the plate electrically coupled to an electrical ground by a shunting conductor substantially conducting electrical current pulses having durations greater than a first predetermined value, the shunting conductor substantially not conducting current pulses having durations less than a second predetermined value, the capacitive obstruction sensing means having an output to the controller, the capacitive obstruction sensing means comprising:

a source of DC current for charging the plate;

a voltage pulse source adapted to output a discharging voltage pulse having a duration less than the second predetermined value; and a discharging switch having an open state and a closed state, the discharging switch moving from its open to its closed state responsive to the discharging voltage pulse, the discharging switch connecting the plate to a charge measuring means when in the closed state, the discharging switch otherwise not connecting the plate to the charge measuring means;

wherein the controller is adapted to stop the motor if the output from the obstruction sensor exceeds a predetermined threshold value.

2. The control system of claim 1 wherein the voltage pulse source is further adapted to output a charging pulse, and wherein the capacitive obstruction sensing means further comprises a charging switch having an open state and a closed state, the charging switch moving from its open to its closed state responsive to the charging pulse, the charging switch connecting the source of DC current to the plate when in its closed state, the charging switch otherwise disconnecting the source of DC current from the plate.

3. The control system of claim 1 wherein the shunting conductor is water.

4. The control system of claim 1 wherein the end-of-travel sensing means comprises an encoder.

5. The control system of claim 1 wherein the motor is an electric motor and the end-of-travel sensing means comprises means of measuring a current supplied to the electric motor.

6. The control system of claim 1 wherein the end-of-travel sensing means comprises a capacitive sensing plate.

7. The control system of claim 1 further comprising position sensing means adapted to determine when the leading edge is within a predetermined distance of being in the closed state, and wherein the controller is adapted to increase the threshold value when the leading edge is within the predetermined distance of the closed state.

8. A control system for controlling a panel closure responsive to an object adjacent at least one of a plurality of capacitive sensing plates, the panel disposed on a vehicle having a chassis ground, the plurality of sensing plates comprising at least three plates, the system comprising:

a motor adapted to move the panel between a closed state, in which a leading edge of the panel abuts a predetermined portion of the vehicle and an open state in which the leading edge of the panel is distal therefrom;

a controller adapted to supply a plurality of control outputs to the motor;

a capacitance measurement circuit adapted to separately measure an electrical capacitance between each of the plurality of sensing plates and the chassis ground and to provide a separate output associated with each of the respective plates to the controller, the capacitance measurement circuit comprising:

a source of dc voltage;

pulse generating means for generating a plurality of charging pulses, each of the charging pulses having a subsequent discharging pulse associated therewith, a charging switch having an open state and a closed state, the charging switch moving from its open to its closed state responsive to the charging pulse, the charging switch connecting the voltage source to the respective plate when in its closed state, the charging switch otherwise disconnecting the voltage source from the respective plate;

a discharging switch having an open state and a closed state, the discharging switch moving from its open state to its closed state responsive to the discharging pulse, the discharging switch connecting the respective plate to a charge measuring means when in its closed state, the discharging switch otherwise not connecting the respective plate to the charge measuring means;

whereby a quantity of charge representative of the capacitance of the respective plate is transferred to the charge measurement means, and whereby a change in the capacitance of the respective plate is indicative of the proximate presence of a body adjacent the respective plate;

an operator's keypad comprising two or more of the plurality of capacitive plates; and at least one capacitive obstruction sensing plate adjacent the predetermined portion of the vehicle.

9. The control system of claim 8 wherein the panel is a window and wherein the operator's keypad comprises at least an UP key and a DOWN key.

10. The control system of claim 8 wherein the panel is shunted to the chassis ground by water.

11. The control system of claim 8 wherein the panel comprises a window of the vehicle and wherein the capacitive obstruction sensing plate comprises a conductor disposed within an elastomeric channel.

12. A method of controlling a panel closure, in which the panel is moved by a motor and a drive mechanism from an open state in which a leading edge of the panel is distal from a frame member having a capacitive sensing plate adjacent thereto to a closed state in which the leading edge is adjacent the frame member, the method responsive to the presence of an obstruction that changes a value of capacitance measured at the sensing plate by more than a predetermined threshold amount, and wherein the obstruction does not contact the panel, the method comprising the steps of:

a) controlling the motor to move the panel from the open to the closed state when no obstruction is present and storing a plurality of records, each of the records comprising an instantaneous position value measured from the drive mechanism; and the capacitance value measured from the capacitive sensing plate at the same time at which the associated position value is measured;

b) subsequently controlling the motor to move the panel from the open toward the closed state and comparing, at each of the plurality of position values, the respective stored capacitance value with a currently measured capacitance value;

c) stopping the motion of the panel if the currently measured capacitance value and the respective stored capacitance value differ by more than the threshold amount; but otherwise moving the panel to the closed state.

13. The method of claim 12 wherein the instantaneous position value is measured with an encoder.

14. The method of claim 12 wherein in step c), if the position of the leading edge of the panel is further from the frame member than a predetermined distance, the threshold amount is replaced with a second, smaller, value of capacitive difference.

15. The method of claim 12 wherein, if the panel is moved to the closed state in step c) responsive to the absence of an obstruction, the method comprises additional steps of:

measuring the current value of the capacitance with the panel in the closed state;

comparing the current value of the capacitance in the closed state with the stored value of the capacitance in the closed state; and changing the threshold amount by the difference between the current value of the capacitance in the closed state and the stored value of capacitance in the closed state.

* * * * *